(12) United States Patent
Di Stefano

(10) Patent No.: US 6,426,638 B1
(45) Date of Patent: Jul. 30, 2002

(54) COMPLIANT PROBE APPARATUS

(75) Inventor: Thomas H. Di Stefano, Los Gatos, CA (US)

(73) Assignee: Decision Track LLC, Monte Sereno, CA (US)

( * ) Notice: Subject to any disclaimer, the term of this patent is extended or adjusted under 35 U.S.C. 154(b) by 0 days.

(21) Appl. No.: 09/564,982

(22) Filed: May 2, 2000

(51) Int. Cl.[7] .............................................. G01R 31/02
(52) U.S. Cl. ...................................... 324/754; 324/762
(58) Field of Search ............................. 324/158.1, 754, 324/755, 756, 757, 758, 762; 29/825, 885, 25.01, 846

(56) References Cited

U.S. PATENT DOCUMENTS

| | | |
|---|---|---|
| 3,795,037 A | 3/1974 | Luttmer |
| 3,806,801 A | 4/1974 | Bove |
| 4,189,825 A | 2/1980 | Robillard et al. |
| 4,312,117 A | 1/1982 | Robillard et al. |
| 4,585,991 A | 4/1986 | Reid et al. |
| 4,912,399 A | 3/1990 | Greub et al. |
| 4,916,002 A | 4/1990 | Carver |
| 4,961,052 A | 10/1990 | Tada et al. |
| 5,012,187 A | 4/1991 | Littlebury |
| 5,055,780 A | 10/1991 | Takagi et al. |
| 5,073,117 A | 12/1991 | Malhi et al. |
| 5,172,050 A | 12/1992 | Swapp |
| 5,225,771 A | 7/1993 | Leedy |
| 5,513,430 A | 5/1996 | Yanof et al. |
| 5,531,022 A | 7/1996 | Beaman et al. |
| 5,559,444 A | 9/1996 | Farnworth et al. |
| 5,611,696 A | 3/1997 | Donner et al. |
| 5,841,291 A * | 11/1998 | Liu et al. ..................... 324/755 |
| 5,878,486 A | 3/1999 | Eldridge et al. |
| 5,977,787 A | 11/1999 | Das et al. |
| 6,068,669 A * | 5/2000 | Farnworth et al. ......... 29/25.01 |
| 6,084,420 A * | 7/2000 | Chee ........................... 324/754 |
| 6,202,297 B1 * | 3/2001 | Faraci et al. ................... 29/837 |

OTHER PUBLICATIONS

Greene, K. F., and A. W. Rzant, IBM Technical Disclosure Bulletin, "Flexible Contact Probe", vol. 15, No. 5, p. 1513, 1972, Month Unavailable).
Leslie, Brian and Farid Matta, IEEE International Test Conference, "Membrane Probe Card Technology (The Future for High Performance Wafer Test)", pp. 601–607, 1988, (Month Unavailable).
Kiewit, D. A., Rev. Sci. Instrum., "Microtool Fabrication by Etch Pit Replication", vol. 44, No. 12, pp. 17–18, 1973.
Bassous, Ernest, IEEE Transactions on Electron. Devices, "Fabrication of Novel Three–Dimensional Microstructures by the Anisotrophic Etching of (100) Silicon", vol. 25, No. 10, pp. 1178–1185, 1978, (Month Unavailable).

* cited by examiner

Primary Examiner—Michael J. Sherry
Assistant Examiner—Paresh Patel
(74) Attorney, Agent, or Firm—Townsend and Townsend and Crew LLP; Kenneth R. Allen

(57) ABSTRACT

A mechanically compliant probe for electrically connecting to contact pads on microelectronic devices. The probe is used for burn-in of integrated circuits at the wafer level. Additional applications include probe cards for testing integrated circuits and sockets for flip-chips. One embodiment of the probe includes a probe tip (81) which is held on an extension arm (82) projecting laterally from an elongated flat spring (83). The spring is supported above a substrate (89) by posts (85) such that the probe tip moves vertically in response to a contact force on the probe tip. Deflection of the probe tip is compliantly limited by bending and torsional flexure of the sheet spring. Mechanical compliance of the tip allows arrays of the probe to contact pads on integrated circuits where the pads are not precisely planar.

17 Claims, 14 Drawing Sheets

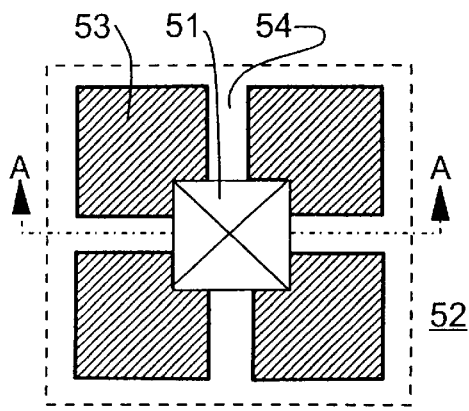
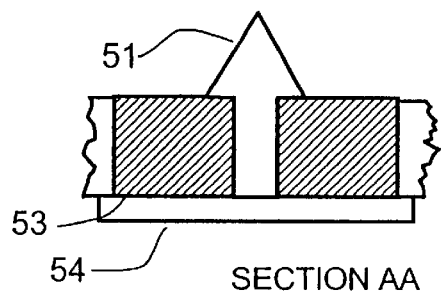
FIG. 3A
PRIOR ART
FIG. 3B
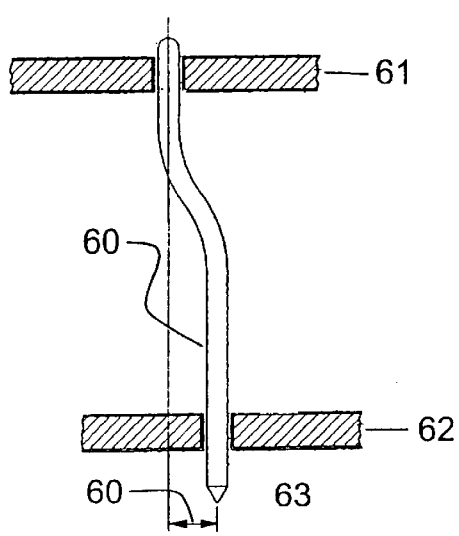
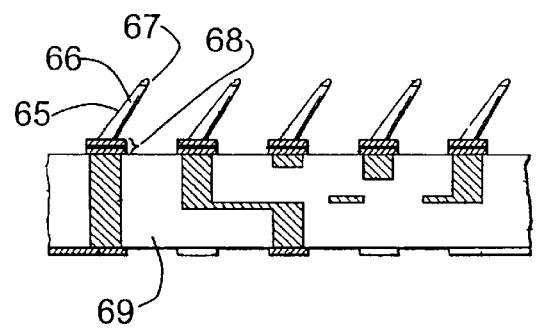
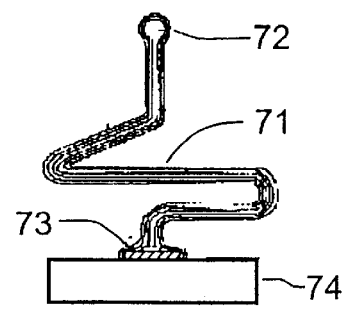
FIG. 4A
PRIOR ART
FIG. 4B
FIG. 4C

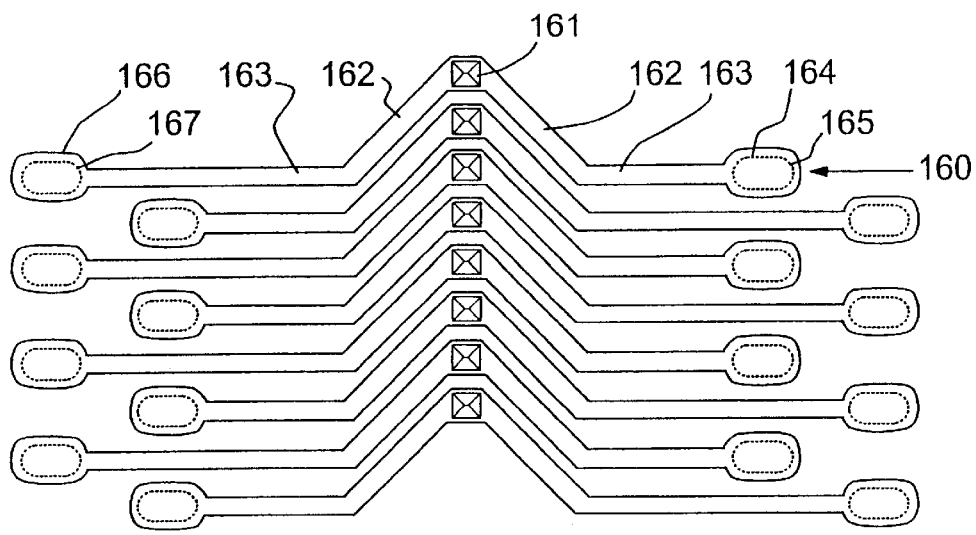
FIG. 13A
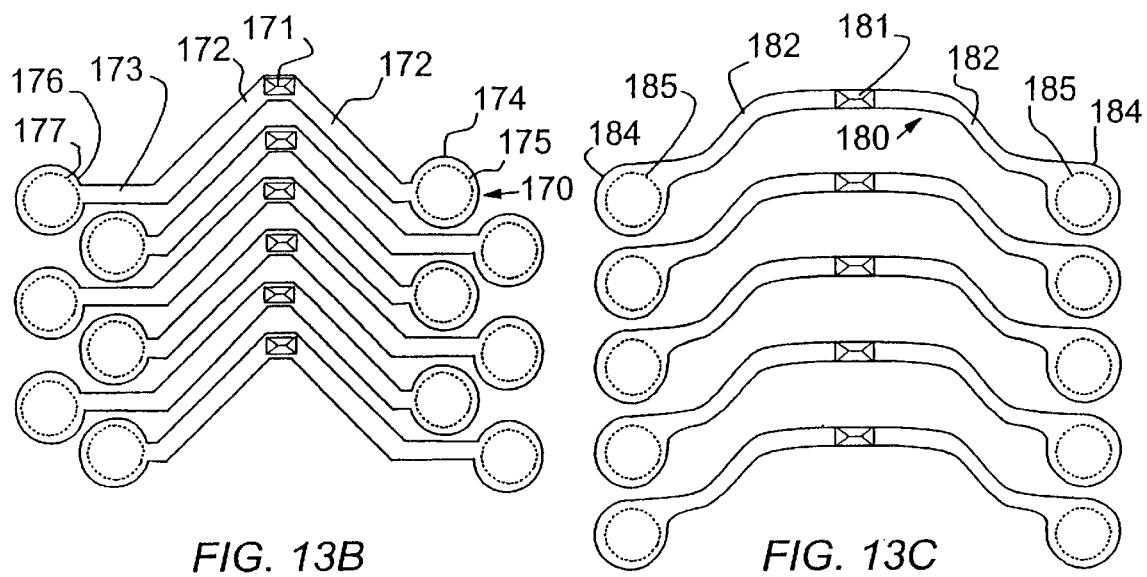
FIG. 13B
FIG. 13C

COMPLIANT PROBE APPARATUS

CROSS REFERENCE TO RELATED APPLICATIONS

This Application is related to a co-pending application Ser. No. 09/563,365 entitled "CONNECTOR APPARATUS," filed contemporaneously herewith by the same inventor.

FIELD OF THE INVENTION

This invention relates to a compliant probe apparatus. In particular, this invention relates to the burn-in and testing of microelectronic devices, and specifically to contact assemblies used for connecting electrical signals to integrated circuits during burning-in and testing of individual chips and of full wafers.

BACKGROUND OF THE INVENTION

Microelectronic devices are subjected to a series of test procedures during the manufacturing process in order to verify functionality and reliability. Prior art testing procedures conventionally include wafer probe testing, in which microelectronic device chips are tested to determine operation of each chip before it is diced from the wafer and packaged. Prior art probe cards are built of long cantilever wires that are used to test one or several chips at a time at the wafer level.

Typically, not all chips on a wafer are found to be operable in the wafer probe test, resulting in a yield of less than 100% good devices. The wafer is diced into individual chips and the good chips are assembled into packages. The packaged devices are dynamically burned-in by loading into sockets on burn-in boards and electrically operating at a temperature of from 125° C. to 150° C. for a burn-in period of 8 to 72 hours in order to induce any defective devices to fail. Burn-in accelerates failure mechanisms that cause infant mortality or early failure of the devices, and allows these defective devices to be screened out by a functional electrical test before they are used commercially.

A full functional test is done on packaged devices, which are operated at various speeds in order to categorize each by maximum speed of operation. Testing discrete packaged devices also permits elimination of any devices that failed during the burn-in process. Burn-in and test of packaged devices is accomplished by means of sockets specially suited to the burn-in conditions and to high speed testing respectively. As a result, conventional manufacturing processes are expensive and time consuming because of repeated handling and testing of individual discrete devices through a lengthy set of steps that adds weeks to the total manufacturing time for the device.

A considerable advantage in cost and in process time can be obtained by burn-in and test of the wafer before it is diced into discrete devices. Additional savings can be obtained by fabricating chip size packages on each device on a wafer before the wafer is diced into discrete devices. A considerable effort has been expended by the semiconductor industry to develop effective methods for wafer level packaging, burn-in and test in order to gain benefits of a greatly simplified and shortened process for manufacturing microelectronic devices. In order to reap these benefits, it is necessary to provide means to burn-in and speed test chips before they are diced from the wafer into individual discrete devices.

Conventional cantilever wire probes, however, are not suited to burn-in and speed testing of devices on the wafer. Cantilever wire probes are too long and bulky to allow simultaneous contact to all of the devices on a wafer, as required for simultaneous burn-in of all of the devices on the wafer. In addition, long cantilever wire probes are not suitable for functional testing of high-speed devices, among other things, because of a high self and mutual inductance of the long, parallel wires comprising the probes.

A small, high-performance probe that can be made at low cost is required for practical application of wafer burn-in and test procedures. To be useful for wafer burn-in and test, the desired probes must reliably contact all of the pads on the devices under test while they are on the undiced wafer. Probes for contacting the wafer must also provide electrical contact to pads on devices even, and especially, where the pads vary in height on the surface of the wafer. In addition, the probes must break through any oxide layers on the surface of the contact pads in order to make a reliable electrical contact to each pad. Many approaches have been tried to provide a cost-effective and reliable means to probe wafers for burn-in and test, without complete success.

The prior art reveals a number of attempts that have been tried to provide small, vertically compliant probes for reliably contacting the pads on devices on a wafer. According to the invention represented by U.S. Pat. No. 4,189,825, a cantilever probe is provided for testing integrated circuit devices. In FIG. 1, cantilever 28 supports sharp tips 26 above aluminum contact pads 24 on a chip 23. A compliant member 25 is urged downward to move tips 26 into contact with pads 24. An aluminum oxide layer on pad 24 is broken by sharp tip 26 in order to make electrical contact between tip 24 and the aluminum metal of pad 24. The rigidity of small cantilever beams, however, is generally insufficient to apply the force to a tip that is necessary to cause it to break through an aluminum oxide layer on a contact pad, without an external means of applying force to the cantilever. Cantilever beams of glass, silicon, ceramic material, and tungsten have also been tried in various configurations, without success in providing burn-in probes of sufficient force and flexibility.

A flexible membrane probe is described in Flexible Contact Probe, IBM Technical Disclosure Bulletin, October 1972, page 1513 as shown in FIG. 2A. A flexible dielectric film 32 includes terminals 33 that are suited to making electrical contact with pads on integrated circuits. Terminals 33 are connected to test electronics by means of flexible wires 34 attached to contact pads 35 on terminals 33. Probes fabricated on a flexible polyimide sheet were described in the Proceedings of the IEEE International Test Conference (1988) by Leslie et al. The flexible sheet allows a limited amount of vertical motion to accommodate variations in height of bond pads on integrated circuits on a wafer under test. Membrane probes such as that described by Leslie et al provide connections to integrated circuit chips for high performance testing. However, dimensional stability of the membrane is not sufficient to allow contacts to pads on a full wafer during a burn-in temperature cycle.

Fabrication of the contacts on a thin silicon dioxide membrane as described in U.S. Pat. No. 5,225,771 is shown in FIG. 2B. A silicon dioxide membrane 40 has better dimensional stability than polyimide, thereby somewhat ameliorating the dimensional stability problem of mating to contact pads on a wafer under burn-in test. Probe tips 41 are connected by vias 44 through membrane 40 to circuit traces 45 that are linked to an additional layer of circuitry 42 above a dielectric film 43. However, limited vertical compliance of the test probes on silicon dioxide membrane 40 renders use of such probe arrays unreliable for use in burn-in of devices on a semiconductor wafer.

Fabrication of an array of burn-in probes on a semiconductor wafer is described in U.S. Pat. No. 4,585,991, especially as illustrated in FIGS. 3A and 3B showing a top plan view and a sectional view respectively. Probe 51 is a pyramid attached to semiconductor wafer substrate 52 by arms 54. Material 53 is removed from the semiconductor wafer 52 in order to mechanically isolate the probe 51. A probe as in FIG. 3A provides a limited vertical movement but it does not allow space on the substrate for wiring needed to connect an array of probes to test electronics required for dynamic burn-in.

Another marginally successful approach to providing flexible probes to device contact pads involves the use of flexible wires or posts to connect the test circuitry to the pads. A flexible probe is described in U.S. Pat. No. 5,977,787 as shown in FIG. 4A. There, probe 60 is a buckling beam, earlier generally described in U.S. Pat. No. 3,806,801. Probe 60 is adapted for use in burn-in of devices on a wafer. Probe 60 is held by guides 61 and 62, that have a coefficient of expansion similar to that of the wafer being tested. The probe tip 63 is offset by a small distance 60 to provide a definite modality of deflection for beam 60. Although buckling beams are well suited to testing individual integrated circuit chips, they are too expensive to be used for wafer burn-in where thousands of contacts are required. Further, electrical performance of buckling beam probes is limited because of the length required for adequate flexure of the beam.

Another approach using flexible posts as disclosed in U.S. Pat. No. 5,513,430 is shown in FIG. 4B. FIG. 4b shows flexible probes in the form of posts 66 that are able to bend in response to force on probe tip 67. Posts 66 are formed at an angle to a substrate 69 in order to allow them to flex vertically in response to a force on tip 67 from mating contact pads. Posts 66 have a taper 65 from the base terminal 68 to tip 67 in order to facilitate flexure.

Yet another approach using flexible wires and posts as disclosed in U.S. Pat. No. 5,878,486 is shown in FIG. 4C. The probe shown in FIG. 4C comprises a probe tip 72 on a spring wire 71 that is bent to a specific shape in order to facilitate flexure. Wire 71 is joined to substrate 74 by a conventional wire bond 73. Probes of the type shown in FIG. 4C require a long spring length to achieve the contact force and compliancy needed for wafer burn-in. Additionally, such probes that use individual wires are too expensive for use in wafer burn-in where many thousands of probes are required for each wafer.

Further approaches to providing flexible probes involve the use of compliant layers interposed between a test head and a device being tested, such that terminals on the test head are electrically connected to mating contact pads on the device. The electrical connector described in U.S. Pat. No. 3,795,037 utilizes flexible conductors embedded in an elastomer material to make connections between mating pairs of conductive lands that are pressed into contact with the top and bottom surfaces of the electrical connector. Many variations of flexible conductors are known including slanted wires, conductive filled polymers, plated posts and other conductive means in elastomeric material in order to form compliant interposer layers.

The approaches listed above, however, and other attempts have been unsuccessful in providing a high performance probe that allows economical burn-in and speed test of microelectronic devices on a wafer before the wafer is diced into discrete chips.

SUMMARY OF THE INVENTION

In accordance with the present invention, a small compliant probe is disclosed that includes a conductive tip, which is positioned on a supporting surface in a manner that allows a tip on the probe to move flexibly with respect to the supporting surface. In a preferred embodiment, the probe tip moves vertically in response to the force of a mating contact pad as it is biased against the tip. Mechanical compliance of the probe of the present invention allows electrical contact to be made reliably between the probe and a corresponding contact pad on a microelectronic device, where the mechanical compliance accommodates variations in height of the contact pad.

It is an object of the present invention to provide a method and means for making electrical connection to contact pads on microelectronic devices on an undiced wafer in order to burn-in the devices before they are diced into separate chips. Compliant probes according to the invention allow reliable electrical connections to be made simultaneously to all of the contact pads arrayed on the surface of a wafer so that microelectronic devices on the wafer can be burned-in economically.

Another object of the present invention is to provide a fixture for burn-in of microelectronic devices on undiced wafers. The fixture electrically connects contact pads on each device to drive circuitry that supplies electrical signals to the device as required during dynamic burn-in at high temperature. Electrical signals and power are supplied to all of the chips on a wafer simultaneously. Mechanical compliance of probes in the fixture accommodates variations in height of the contact pads and in the probe tips such that each probe tip remains in contact with its mating contact pad throughout the temperature cycle of the burn-in process.

Yet another object of the preferred embodiment of the present invention is to provide an electrical probe card that allows high speed testing of unpackaged microelectronic devices. Small, compliant probes as taught herein are used to make temporary connections to corresponding pads on a device in order to apply electrical test signals to that device and to measure electrical signals from that device. The small size of the compliant probe allows high speed electrical signals to be passed to and from the device without losses due to excessive inductance or capacitance associated with wire probes as used in the prior art.

A further object of the present invention is to provide a means for burning-in, testing and operating microelectronic devices where electrical contacts on the device are disposed in an area array over a surface of the device. Small, compliant probes as taught in this disclosure are used to make reliable electrical connections to contacts on the device, where the contacts are arranged in an area array. Mechanical compliance allows the tip of each probe to maintain electrical contact with a mating contact on the device notwithstanding variations in the height of contacts on the device both at room temperature and at the operating temperature range of the device.

Another object of a preferred embodiment of the present invention is to provide a small socket for connecting integrated circuit chips to electrical circuits for purposes of burn-in, test and operation of the chip. The small size of each probe contact in the socket allows high-speed operation of a chip mounted in the socket. Mechanical compliance of the probes as taught herein enables reliable electrical connections to be made to a rigid chip with minimal or no packaging. Compliant probes according to the present invention allow construction of small, economical sockets for chip scale packages and for flip-hips.

The probe disclosed herein is significantly improved over conventional cantilever probes in that it provides a greater range of compliant motion of the probe tip for any given probe force and probe size. A conventional cantilever probe is limited in the range of motion it provides in response to a given force before the elastic limit of the probe material is reached. The maximum mechanical stress in cantilever probes is concentrated on the surface of the cantilever material at the point of flexure. The present invention provides a greater range of motion for a given spring material and probe force, before reaching the elastic limit of that material.

The invention increases manufacturing efficiency for microelectronic devices by reliably providing test and burn-in functions at the wafer level, while at the same time reducing the size of the test fixture. The mechanically compliant probe of the present invention provides a large range of motion relative to the size of the probe. This range of motion is important in making connections to a device with contact pads that are not substantially in the same plane. The compliant probe tip of the present invention moves flexibly to accommodate differences in the height of mating contact pads while maintaining sufficient force of the probe tip on the contact pad to assure reliable electrical contact there between.

These as well as other objects of the invention are met by providing a mechanically compliant electrical probe. In a preferred embodiment, a probe tip is disposed on an elongated thin strip of material that is supported at both ends and wherein the tip is positioned at a predetermined distance from a center line connecting the centers of the supports at each end of the strip. The probe tip thus supported moves compliantly in a vertical direction by torsional and bending flexure of the thin strip of material.

BRIEF DESCRIPTION OF THE DRAWINGS

The novel features characteristic of this invention are set forth in the appended claims. The invention itself as well as other features and advantages thereof are best understood by reference to the detailed description that follows, read in conjunction with the accompanying drawings wherein:

FIGS. 3A and 3B show views of a probe fabricated on a silicon wafer of the prior art where FIG. 3A shows a plan top view of the probe and FIG. 3B shows a sectional view of the probe;

FIGS. 4A to 4C show flexible post probes of the prior art;

FIG. 7A is a top plan view, FIG. 7B is a sectional view of the probe at rest, and FIG. 7C is a sectional view of the probe when acted upon by force F;

FIG. 9A is a top plan view, FIG. 9B is a sectional view of the probe at rest, and FIG. 9C is a sectional view of the probe when acted upon by force F;

FIG. 12A is a top plan view, FIG. 12B is a sectional view of the probe at rest and FIG. 12C is a sectional view of the probe when acted upon by force F;

FIGS. 13A to 13C show top plan views of alternative designs for compliant probes according to the present invention;

DETAILED DESCRIPTION OF THE PREFERRED EMBODIMENTS

Figure 1:
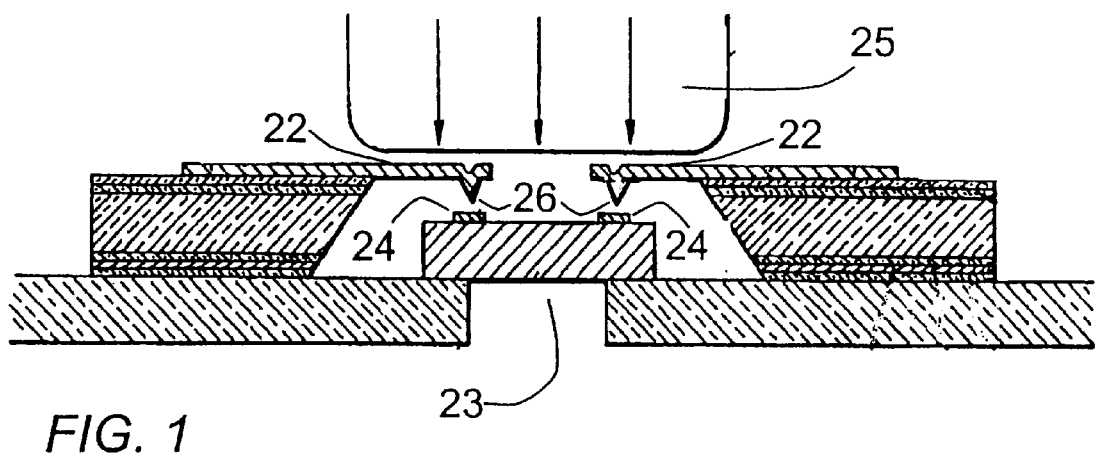
FIG. 1 shows a sectional view of a cantilever probe of the prior art.
Figure 2A:
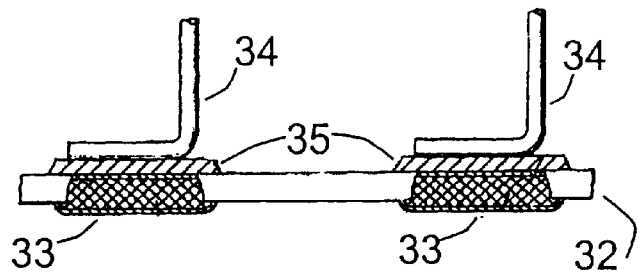
FIGS. 2A and 2B show cross sectional views of flexible membrane probes of the prior art.
Figure 2B:
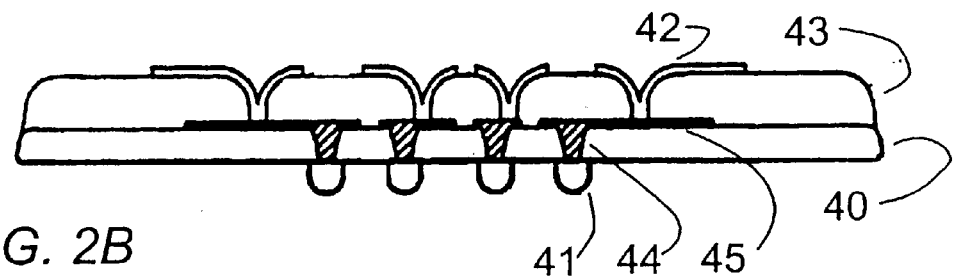
Figure 5:
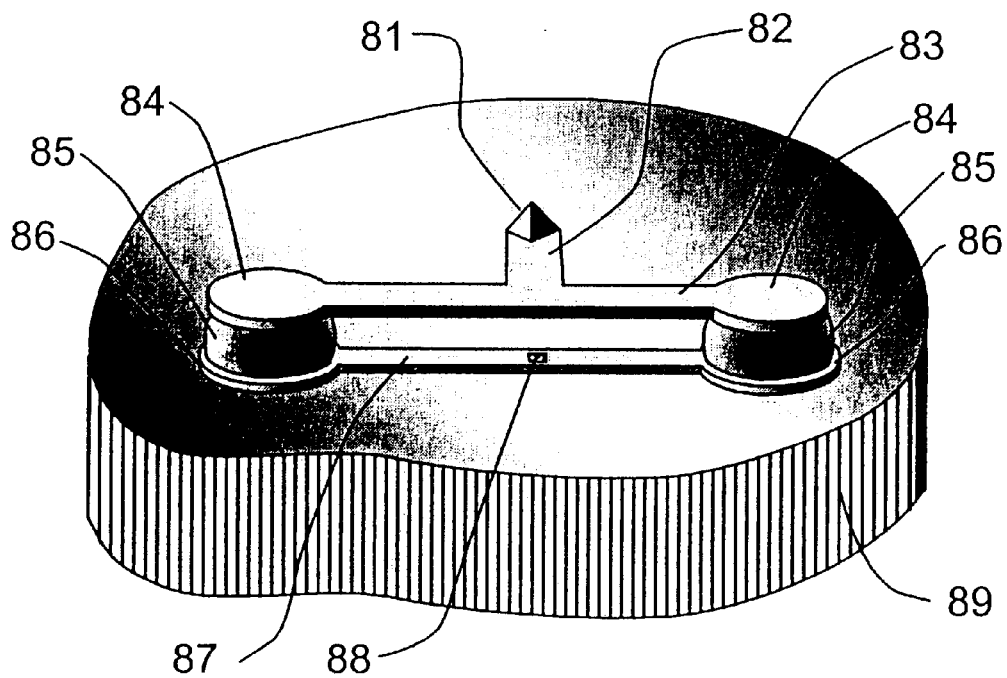
FIG. 5 shows a view of a compliant probe in accordance with the present invention.

Prior art probes are illustrated in FIGS. 1–4. In accordance with the principles of the invention, a first preferred embodiment of a compliant probe is shown in FIG. 5. A probe is disclosed that makes reliable electrical connection to contact pads (not shown) on a microelectronic devices such as integrated circuits (ICs), flip-chips, passive devices, and chip scale packages. The probe provides flexible vertical motion of a probe tip 81 in response to a force on the tip. Thus, as a contact pad is urged into contact with probe tip 81, mechanical compliance of the invention's structure allows the tip to make contact with the mating contact pad at a force sufficient for probe tip 81 to penetrate an insulating oxide film on the pad. Mechanical compliance of the probe accommodates differences in height of the contact pads in a region of the microelectronic device while providing sufficient force on each probe tip to assure a reliable electrical connection between the tip and the corresponding contact pad. Further, mechanical compliance of the pad is necessary to allow the tip to maintain a connection to the corresponding pad during a test or burn-in cycle where thermal expansion may cause warping of the device and of the probe support.

In FIG. 5, probe tip 81 is supported on a lateral extension arm of conductive material 82 that is attached to an elongated flexible strip 83 of conductive material. Elongated flexible strip 83 is supported at each end by posts 85 that are joined to terminals 84 on elongated strip 83. Probe tip 81 moves flexibly in response to a force applied vertically to tip 81. Vertical movement of tip 81 depresses arm 82 and torsionally flexes strip 83 thereby impressing a restoring force on tip 81.

In the compliant probe shown in FIG. 5, posts 85 are supported on substrate 89 by pads 86 which are connected electrically to a circuit trace 87 which is connected in turn to electrical circuitry in substrate 89 by means of a via contact 88 that links circuit 87 on the surface to circuit layers in substrate 89. By the series of links described above, probe tip 81 is connected electrically to circuits in the substrate 89 that operate a device that is connected to the probe. In demanding applications such as burn-in, substrate 89, in a preferred embodiment, is made of silicon or a low expansion ceramic material in order to achieve dimensional stability over a wide temperature range such as those used in burn-in, where a temperature cycle may go from 25° C. to 150° C. or greater.

For operation at high frequencies, the electrical links from probe 81 to via contact 88 are arranged to minimize the inductance of the connection to probe tip 81. The inductive loop is minimized by locating via contact 88 under probe tip 81. While via contact 88 cannot always be so ideally located, the distance between tip 81 and via contact 88 is small in those applications that require high frequency operation.

Figure 6:
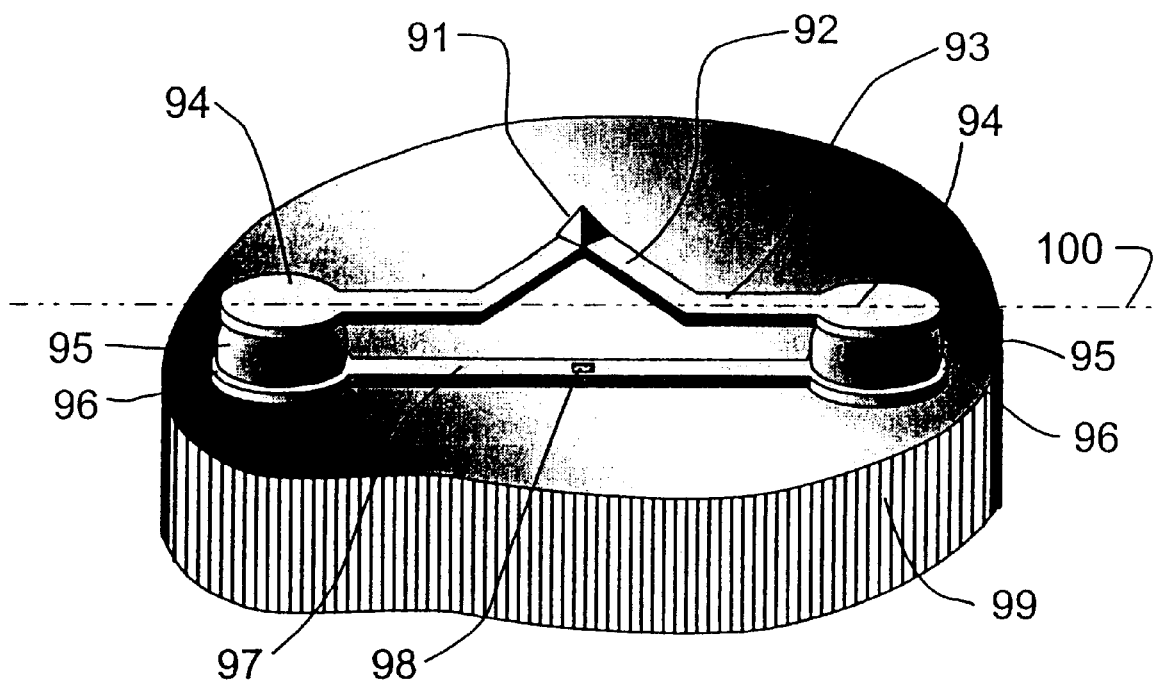
FIG. 6 shows a view of an alternate configuration of a compliant probe in accordance with the present invention.

FIG. 6 shows a second embodiment for the compliant probe of the present invention where conductive arm 82 of FIG. 5 is replaced by a curved or "V" shaped segment 92 of an elongated thin sheet 93 in FIG. 6. Terminals 94 on each end of elongated thin sheet 93 are joined to posts 95, which in turn rest on pads 96 on a substrate 99. Electrical connection to tip 91 is made through sheet 93 to pads 94 joined to posts 95 resting on pads 96 that are connected by a circuit trace 97 connected to electrical circuits in substrate 99 by means of a via contact 98.

As seen in FIG. 6, probe tip 91 is supported on the curved portion 92 of sheet 93 such that the center of probe tip 91 is located at a distance from an imaginary dashed line 100 between posts 95 at each end of elongated thin sheet 93. An initial vertical force on probe tip 91 produces a torque about an axis represented by line 100. The torque causes a torsional flexure of elongated thin sheet 93, which produces a counter force acting to oppose the initial force on tip 91.

Figure 7A:
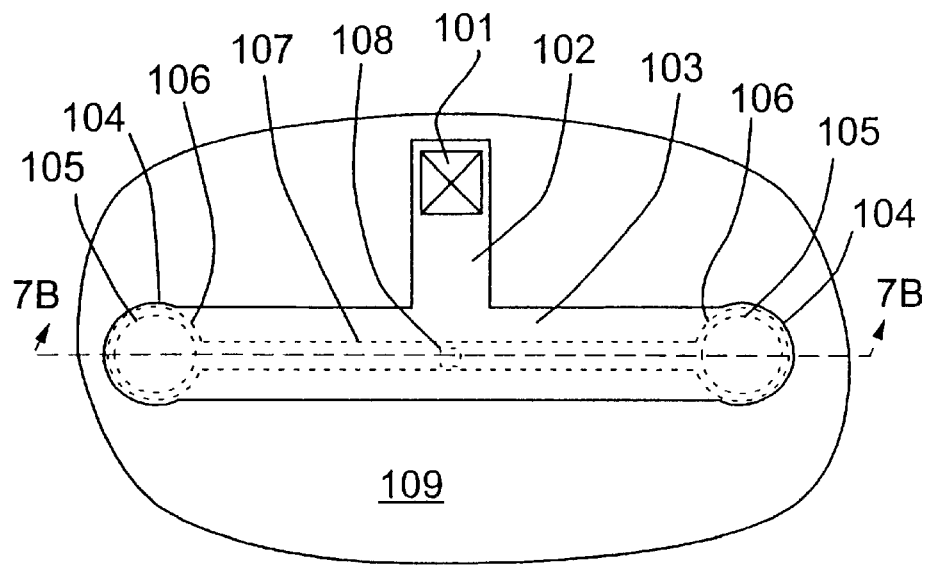
FIGS. 7A to 7C show an embodiment of a compliant probe where

FIG. 7A shows the plan view from above of a first embodiment of the compliant probe of the type illustrated in FIG. 6. A flexible elongated strip 103, in a preferred embodiment is made of a sheet of metal shaped to include a lateral extension 102 at the midpoint of strip 103 and contact pads 104 at each end of strip 103. The electrically conductive material of strip 103 is chosen to exhibit high yield strength and moderate elongation at ultimate failure. Metals chosen from the group consisting of beryllium-copper alloys, columbium, cupro-nickel, molybdenum, nickel, nickel-titanium, stainless steel, titanium, and alloys thereof are suitable. Applicant has determined one suitable metal is beryllium-copper alloy ASTM Spec. No. B534, with a yield strength of 550 mega-Pascals. Another suitable metal is titanium alloy Ti, 8 Al, 1 Mo, 1 V, with a yield strength of 910 mega-Pascals.

Figure 7B:
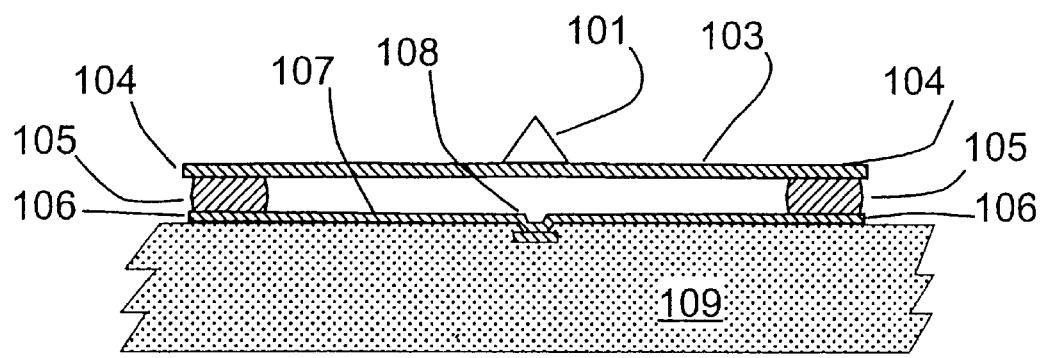
Figure 7C:
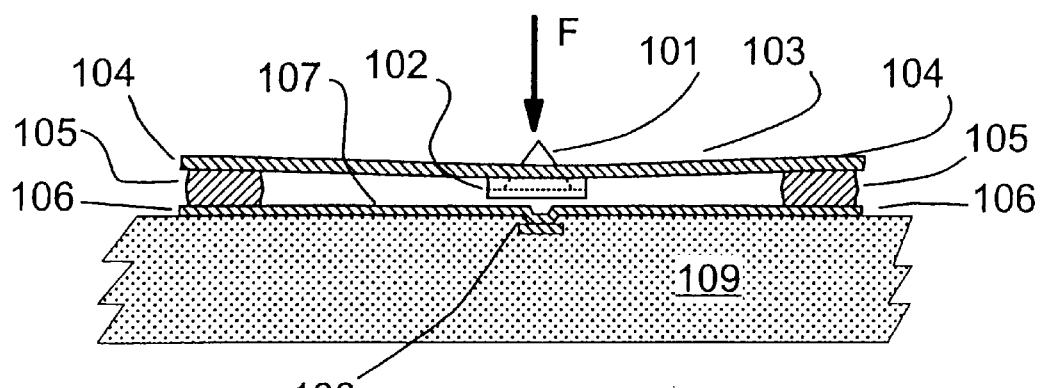

A probe tip 101 shown in FIG. 7A is supported on extension arm 102 such that probe tip 101 depresses vertically toward a substrate 109 in response to a vertical force F. The action of arm 102 and probe tip 101 is shown in sectional views of FIGS. 7B and 7C. A force F applied to probe tip 101 exerts a torque on strip 103, twisting the strip and allowing arm 102 to depress toward substrate 109. As seen in the sectional view in FIG. 7C, the vertical motion of probe tip 101 is due to the action of both beam deflection and torsional bending of strip 103.

Probe tip 101 in a preferred embodiment is a pyramid formed by replication of an etch pit formed in a (100) silicon surface by well-known processes. The tip angle of 54.75° is determined by the (111) crystallographic planes in silicon. The material of the tip is tungsten, which forms a sharp, hard tip that is able to break through aluminum oxide layers on aluminum contact pads typically used on semiconductor IC devices. Applicant has determined that other materials suitable for making hard probe tips may be selected from a group consisting of molybdenum, nickel alloys, osmium, Paliney 7, rhodium, rhenium, titanium, tungsten and alloys thereof.

Fabrication of sharp probe tips by replication of etch pits in silicon is well known in the field of electrical contacts and is well described in a publication in 1973 by D. A. Kiewit in Reviews of Scientific Instruments, Vol. 44, pages 1741–1742. Kiewit describes formation of probe tips that are made by replication of etch pits in silicon by depositing nickel-boron alloy into the pit, and then removing the silicon matrix material to expose the pyramid. Kiewit formed pyramidal etch pits in silicon (100) surfaces by treating the surface with boiling hydrazine hydrate. Any method now known or hereafter developed for making appropriate probe tips is suitable.

Strip 103 is supported above substrate 109 by posts 105 that are joined to contact pads 104 at each end of strip 103. Post 105 is formed of an electrodeposited metal preferably chosen from the group consisting of hard copper, nickel, cupro-nickel alloys, and hard gold. Electrical connection of probe tip 101 to circuits for testing integrated circuits is made by conduction through arm 102, strip 103, contacts 104, posts 105, contact pads 106, a conductor 107 and a via contact 108. The electrical circuit from via contact 108 to probe 101 is configured to form as small a loop as possible in order to reduce inductance and thereby allow operation at the highest frequencies or data rates.

Figure 8A:
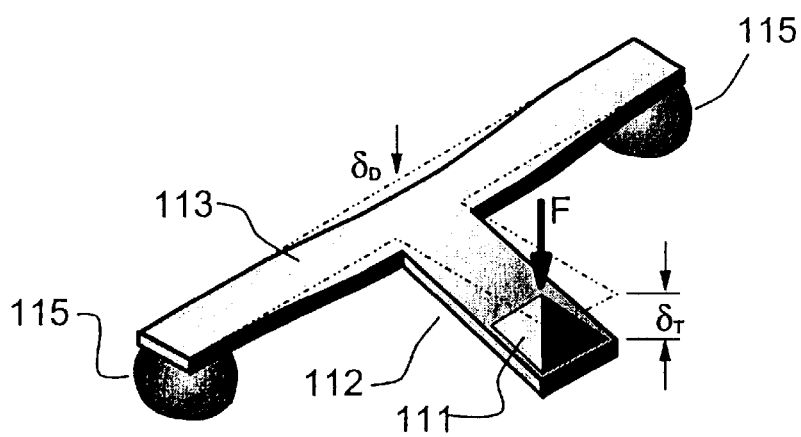
FIG. 8A shows a view of an embodiment of a compliant probe as its probe tip is acted upon by a force F directed vertically.
Figure 8B:
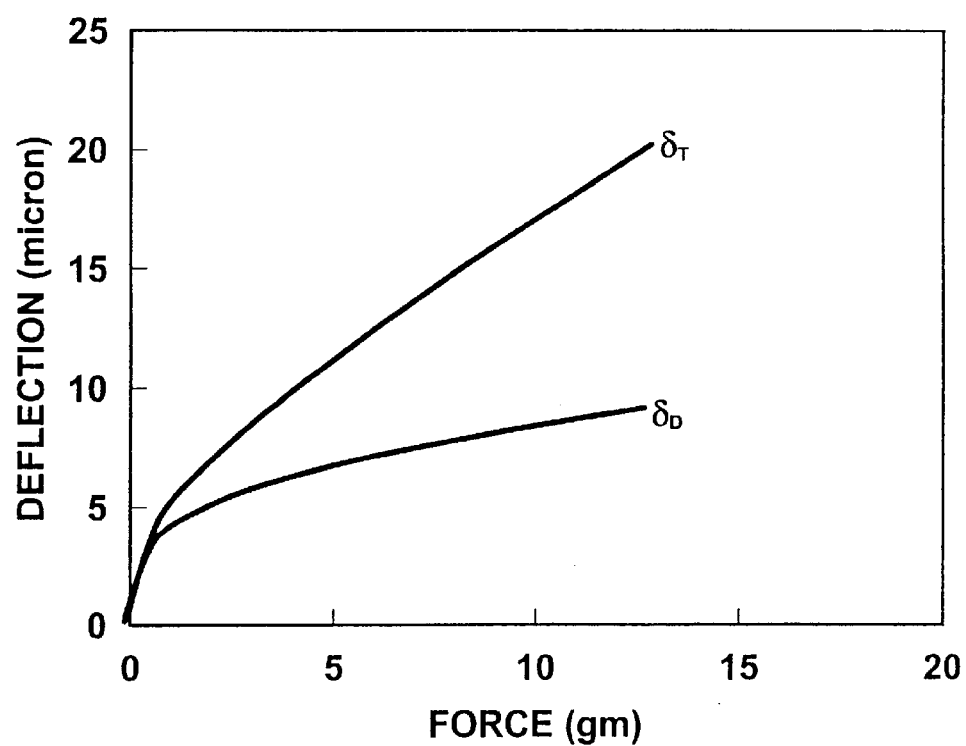
FIG. 8B shows the deflection of the probe tip of FIG. 8A as a function of the force acting on the probe tip.

FIGS. 8A and 8B illustrate in greater detail the operation of a preferred embodiment configuration in which a probe tip 111 is supported by a lateral extension arm 112 on a thin strip of material 113 held between two support posts 115. Force F depresses tip 111 by a deflection of $\delta_T$ in the vertical direction.

The total deflection $\delta_T$ of tip 111 shown in FIG. 8B is a sum of the beam bending component $\delta_D$ and the torsional deflection component. FIG. 8B shows the total deflection $\delta_T$ in microns caused by a force F in grams acting vertically on probe tip 111. For this study, strip 113, in a preferred embodiment, is made of molybdenum with a thickness of 25 microns, a width of 25 microns, and a length of 200 microns. Arm 112, in a preferred embodiment, is 100 microns long from the centerline of strip 113 to the probe tip, as measured in the plane of the strip.

Figure 9A:
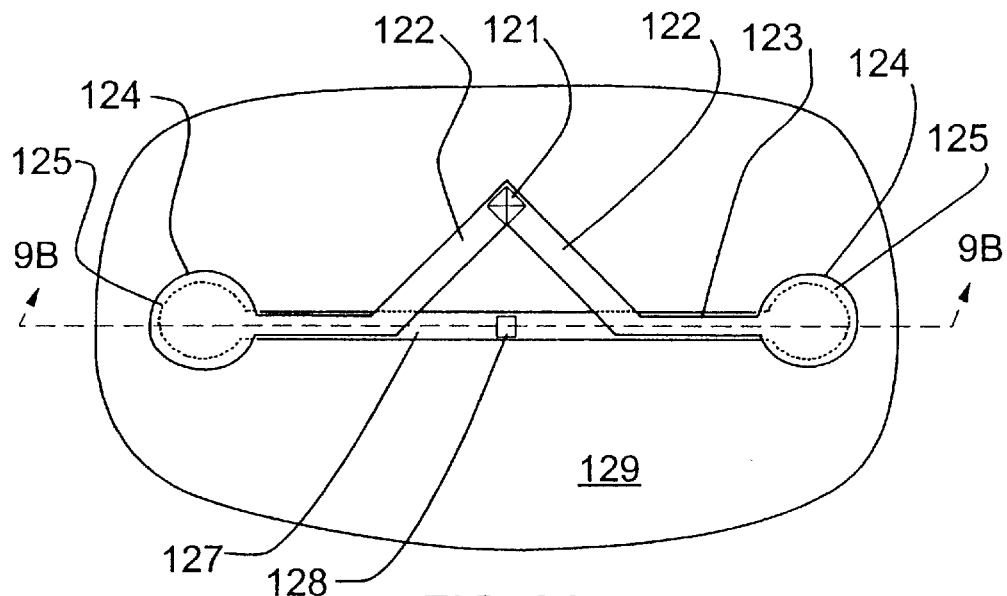
FIGS. 9A to 9C show an embodiment of a compliant probe where

A detailed view of the second preferred embodiment of the compliant probe of the present invention is shown in a top plan view of FIG. 9A. Probe tip 121 is supported on a "V" shaped extension 122 of elongated thin sheet 123. In a preferred embodiment, extension 122 supports tip 121 at a position to one side of an imaginary line connecting the centers of posts 125 that support each end of elongated thin sheet 123. Extension 122 is thicker than the main body of elongated thin sheet 123 in order to prevent distortion to the shape of the extension by applied force F.

Figure 9B:
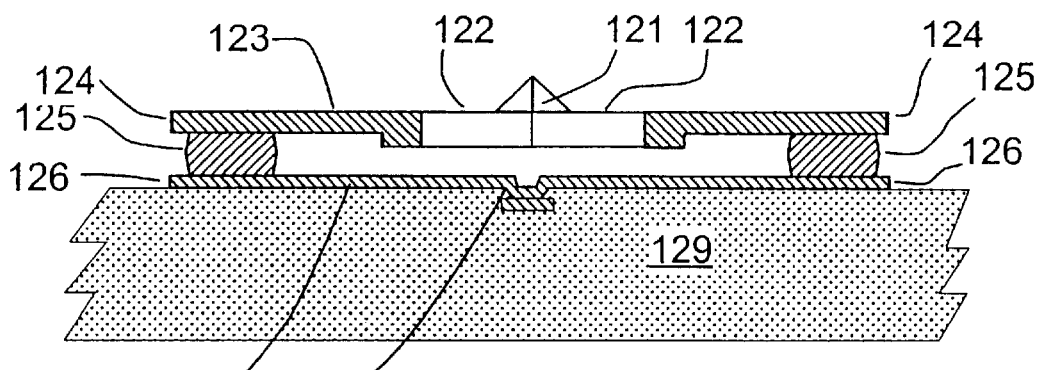
Figure 9C:
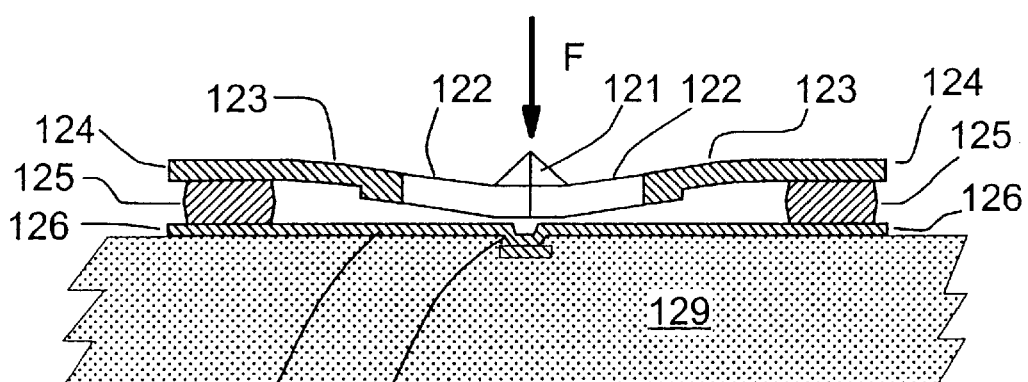

A probe tip 121 declines vertically toward a substrate 129 in response to a vertical force F applied to tip 121. The deflection of extension 122 and probe tip 121 is shown in the sectional views in FIGS. 9B and 9C. A force F applied to probe tip 121 exerts a torque on sheet 123, thereby twisting sheet 123 and allowing extension 122 to depress toward substrate 129. As seen in the sectional view in FIG. 9C, the vertical motion of probe tip 121 is due to both beam deflection and torsional bending of elongated thin sheet 123.

Sheet 123 is supported above substrate 129 by posts 125 joined to contact pads 124 at each end of sheet 123. Posts 125 are rigid metal posts. Electrical connection of probe tip 121 to test circuits is made by conduction through arm 122, sheet 123, contact pads 124, posts 125, contact pads 126, a circuit trace 127, and a via 128. The electrical circuit from via 128 to probe 121 is configured to form as small a loop as possible in order to reduce inductance and thereby allow operation at optimum electrical performance.

Figure 10:
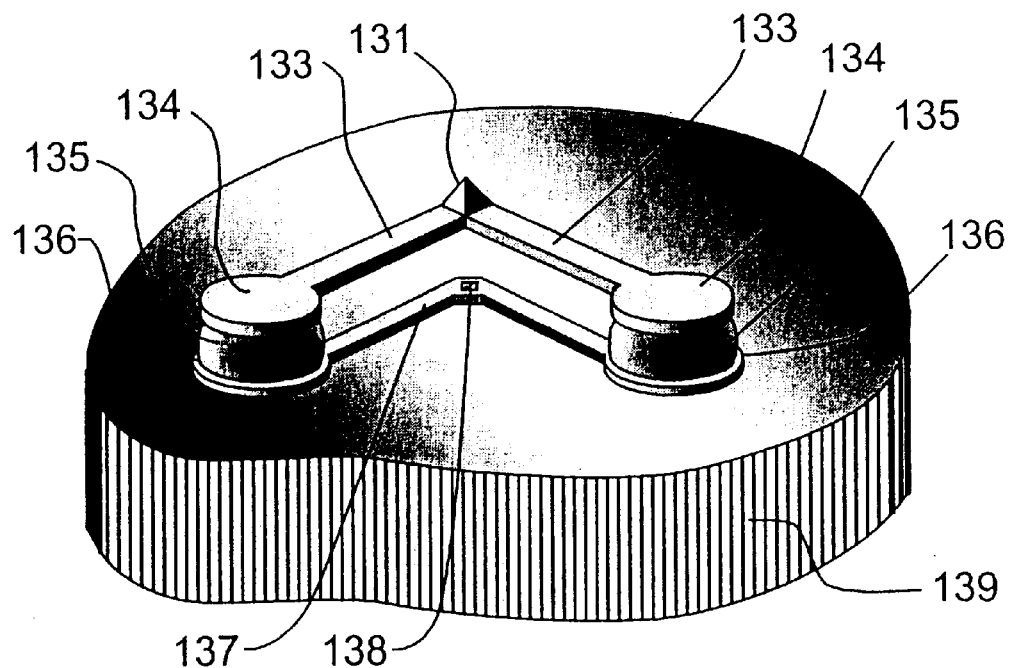
FIG. 10 shows a view of an embodiment of a compliant probe and its connection circuit.
Figure 11:
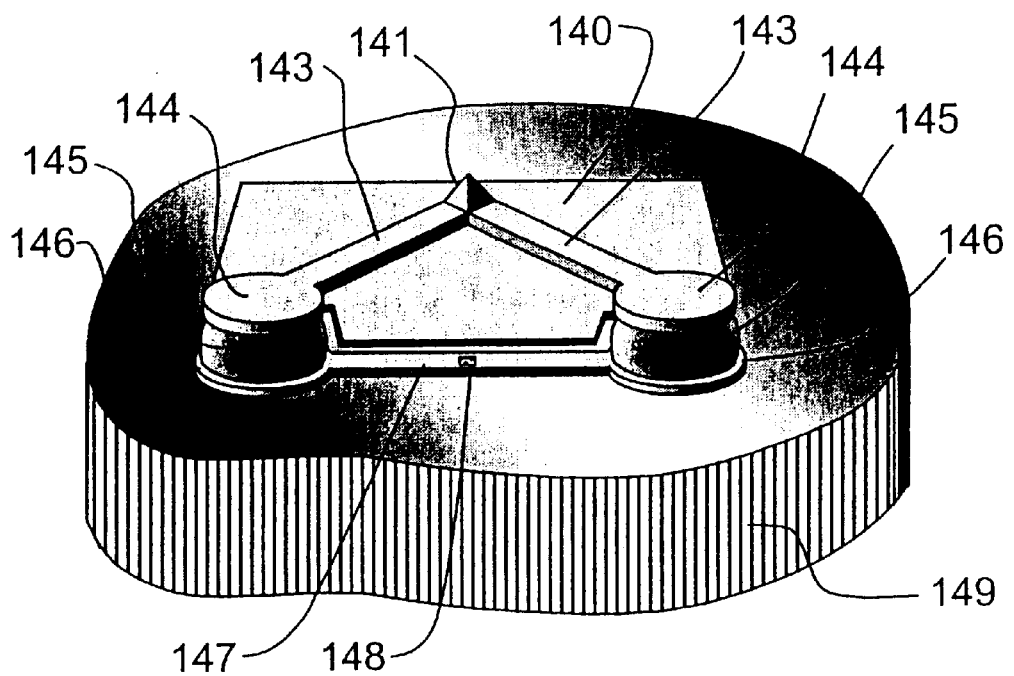
FIG. 11 shows a view of an embodiment of a compliant probe with a ground plane.

FIGS. 10 and 11 show additional embodiments of the compliant probe of the present invention where the function of the extension arm and the thin elongated sheet are combined into one structure. A third embodiment is shown in FIG. 10 wherein a probe tip 131 is disposed on a curved elongated thin sheet 133 such that the center of probe tip 131 is located at a predetermined distance from an imaginary line connecting the centers of support posts 135 at each end of curved sheet 133. Curved elongated thin sheet 133 flexes torsionally and bends in response to a force applied vertically to probe tip 131. The torsional twist is due to the torque generated by the force applied at a distance from the centerline of support posts 135. The amount of torsional flexure relative to beam bending flexure is dependent upon the offset of probe tip 131 from the centerline as a fraction of the length of curved sheet 133. Depending upon the dimensions of the device being tested and the material properties of curved sheet 133. The offset is preferably between 0.05 to 0.5 times the length of curved sheet 133.

The probe of FIG. 10 includes curved sheet 133 that supports probe tip 131 which is offset from the centerline of support posts 135. Electrical connection to the probe tip 131 is made through curved sheet 133 to contact terminals 134. Terminal 134 is in turn joined to posts 135 that rest on contact pads 136 connected to a circuit trace 137 that is linked by a via 138 to test circuits in substrate 139. Via 138 is positioned proximal to the probe tip in order to minimize inductance of the link connecting the test circuits to probe tip 131.

A fourth embodiment of the compliant probe that incorporates a ground plane shield is shown in FIG. 11. The probe of FIG. 11 includes a curved sheet 143 that supports a probe tip 141 located at a position that is offset from the centerline of support posts 145. Electrical connection to the probe tip 141 is through sheet 143 to contact pads 144. In turn, contact pads 144 are joined to posts 145 that rest on terminals 146 connected to a circuit trace 147 that is linked by a via 148 to test circuits in a substrate 149. A ground layer 140 underlies probe tip 141 and shields the probe electrically in order to achieve higher performance.

Figure 12A:
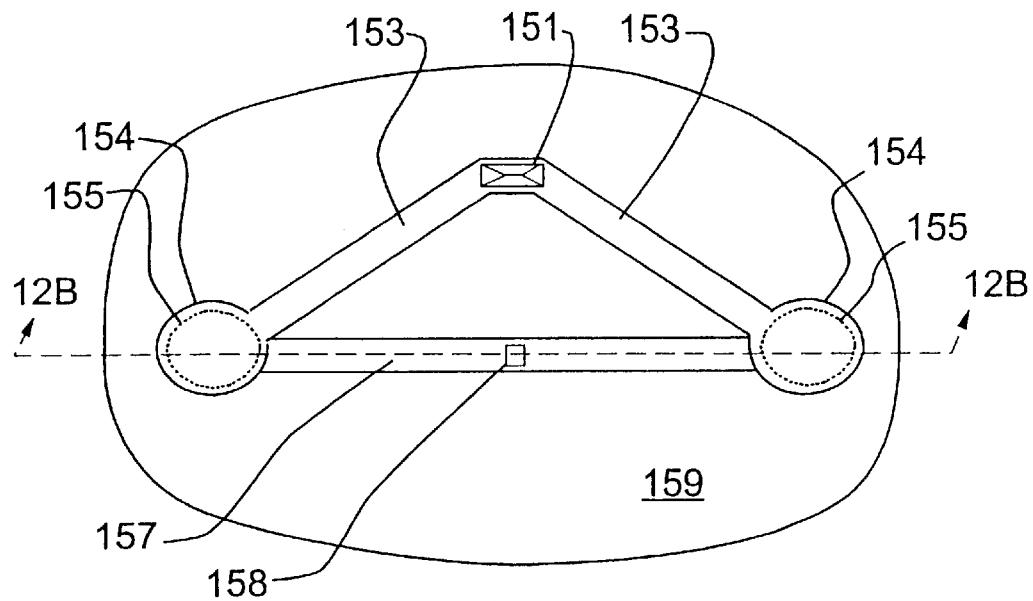
FIGS. 12A to 12C show an embodiment of a compliant probe with its circuit connection where
Figure 12B:
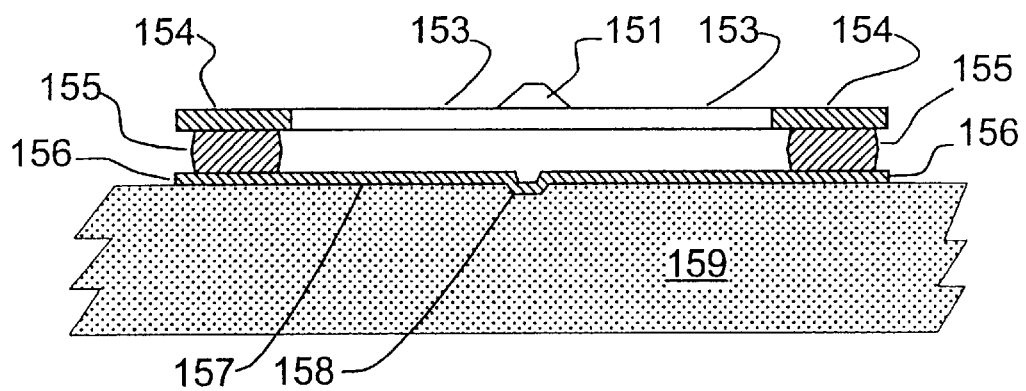
Figure 12C:
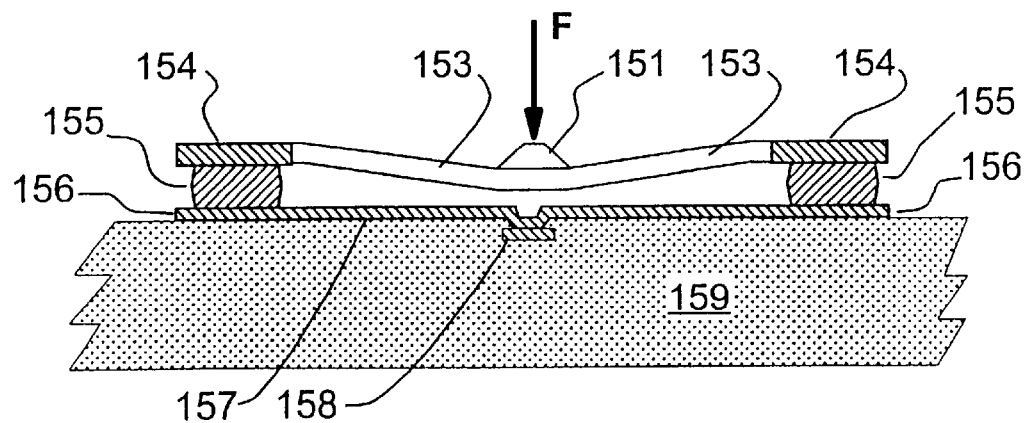

A detailed view of the embodiment illustrated in FIG. 10 is shown in FIGS. 12A–12C. A top plan view of FIG. 12A shows a representative configuration of the third preferred embodiment, where a tip 151 is supported on the midpoint of a "V" shaped flat sheet 153 of spring material. The "V" shaped sheet 153 is supported by terminals 154 disposed at each end of the sheet. The sheet in this embodiment is made of titanium alloy Ti, Al 8, V 4, although other high strength or superplastic materials would serve as well. The thickness of sheet 153 is between 10 and 75 microns, and more preferably the thickness is between 20 and 50 microns. The width of the narrowest section of each arm 153 is between 20 and 200 microns and more preferably the width is between 35 and 75 microns. The distance between the centroid of post 155 at a first end of sheet 153 and the centroid of post 155 at the second end of sheet 153 is about 200 to 1000 microns in length, and more preferably the center to center spacing is 250 to 750 microns.

Response of the probe to a force F on probe tip 151 is illustrated in FIGS. 12B and 12C, showing a sectional view of the compliant probe before and after the application of force F. As shown in FIG. 12C, a force F on probe tip 151 deflects the thin curved sheet 153 downward towards a substrate 159. Thin curved sheet 153 is both bent and twisted torsionally by the deflection. Torsional and bending deflection of sheet 153 generates a counter force that opposes further deflection of tip 151 as it is acted upon by force F.

Probe tip 151 is connected to electrical circuitry by sheet 153 that is supported by posts 155 joined to contact pads 154 of sheet 153. Posts 155 rest upon terminals 156 positioned on substrate 159, where terminals 156 connect to a circuit trace 157. Circuit trace 157 is joined to electrical circuitry in substrate 159 by a conductive via 158. Optionally, a ground plane (not shown) may be inserted between the probe tip 151 and circuitry in substrate 159 in order to shield tip 151 from signals in adjacent circuit traces in substrate 159.

Variations in the design of the sheet spring in the compliant probe are made to accommodate the test requirements of specific microelectronics devices. Several designs are illustrated in FIGS. 13A to 13C. In each case, however, the probe tip is positioned off of the axis determined by an imaginary line through the centroids of the posts supporting the sheet spring at a first and at a second end.

FIG. 13A illustrates a preferred embodiment of a design for a probe 160 where a probe tip 161 is supported at the apex of a "V" shaped segment 162 of a sheet spring 163. Segment 162 is positioned toward one end of spring 163 to allow nesting of springs necessary to achieve a close spacing between probe tips. Posts 165 and 167 are positioned in a staggered pattern to allow close spacing of the individual probes. Correspondingly, contact pads 164 and 166 on opposing ends of sheet spring 163 are matched to posts 165 and 167, respectively.

FIG. 13B illustrates a preferred embodiment of a design for a probe 170 where a probe tip 171 is supported at the apex of a "V" shaped segment 172 of a sheet spring 173. Segment 172 is positioned toward the end of sheet spring 173 to allow nesting of springs necessary to achieve a close spacing between probe tips. Posts 175 and 177 are positioned in a staggered pattern to allow close spacing of the individual probes. Correspondingly, contact pads 174 and 176 on opposing ends of sheet spring 173 are matched to posts 175 and 177, respectively.

FIG. 13C illustrates a preferred embodiment of a design for a compliant probe 180 wherein a probe tip 181 is supported at the midpoint of a curved sheet spring 182. Curved spring 182 is shaped to allow nesting of springs necessary to achieve a close spacing between probe tips. Probe tip 181 is offset from the centerline between centroids of the posts 185 disposed at each end of spring 182. Contact pads 184 at each end of sheet spring 182 are joined to posts 185.

Alternatively, Applicant has determined that unsymmetrical configurations of the compliant probes shown in FIGS. 14A to 14D provide capabilities needed for specific testing and burn-in applications. Unsymmetrical configurations facilitate probing of contact pads in constrained spaces, in corners, and on chips with a small pad pitch. Further, an optional ground contact allows ground shielding to be incorporated into the probe structure.

Figure 14A:
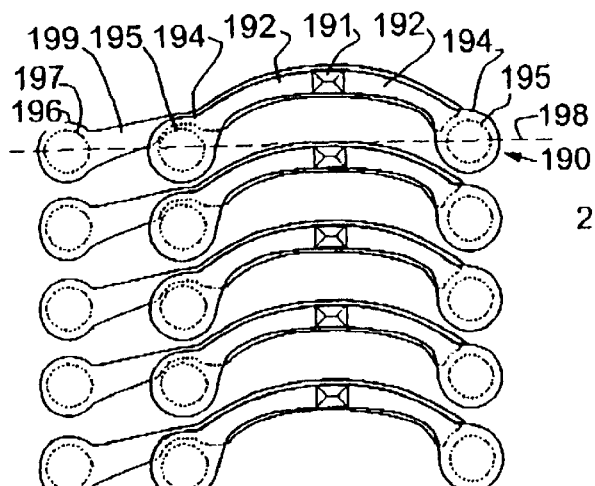
FIGS. 14A to 14D show top plan views of alternative designs for compliant probes according to the present invention.

Compliant probe 190 shown in FIG. 14A utilizes a post 195 to support the first end of an elongated thin sheet 192.

The second end of elongated thin sheet 192 is supported by a post 195. An additional post 197 is used to stabilize the structure against lateral forces. Additional post 197 is also used to make electrical contact with a ground plane 199 incorporated into the probe. Post 197 is joined to ground plane 199 at contact pad 196. Thin sheet 192 is connected to posts 195 that are joined to sheet 192 by contact pads 194.

Thin elongated sheet 192 supports a probe tip 191 disposed at a position that is offset from the central axis 198 of probe 190. The central axis is an imaginary line that connects the centroid of posts 195 and 197 that support the first end of sheet 192 with the centroid of posts 195 that supports the second end of member 192. Force applied to probe tip 191 creates a torque about central axis 198 that causes member 192 to bend and to twist torsionally.

Figure 14B:
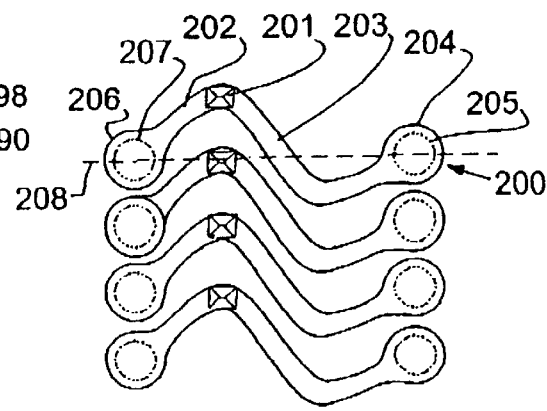

In FIG. 14B, a compliant probe 200 includes an elongated sheet spring with a short segment 202 supported by post 207 and a long segment 203 supported by a post 205. Contact pads 204 and 206 join the sheet to posts 205 and 207, respectively. The sheet spring supports a probe tip 201 that is disposed between segment 202 and segment 203 at a position that is offset from a centerline 208 of probe 200. Centerline 208 is an imaginary line that connects the centroid of post 205 with the centroid of post 207. A force applied to probe tip 201 creates a torque about centerline 208 that causes arms 202 and 203 to bend and to twist torsionally.

Figure 14C:
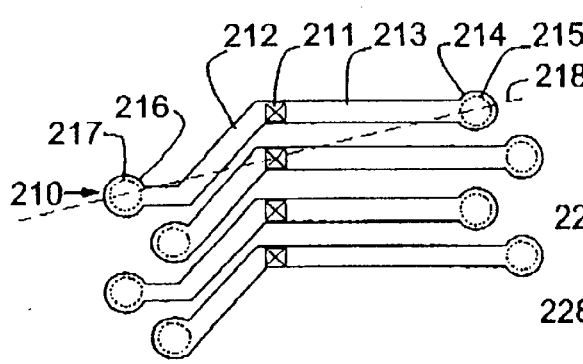

In FIG. 14C, a compliant probe 210 includes a sheet spring with a short segment 212 supported by a contact pad 216 joined to a post 217, and a long segment 213 supported by a contact pad 214 joined to a post 215. The sheet spring supports a probe tip 211 that is disposed between segment 212 and segment 213 at a position that is offset from a centerline 218 of probe 210. Centerline 218 is an imaginary line that connects the centroid of post 215 with the centroid of post 217. Force applied to probe tip 211 creates a torque about centerline 218 that causes thin sheet segments 212 and 213 to bend and to twist torsionally.

Figure 14D:
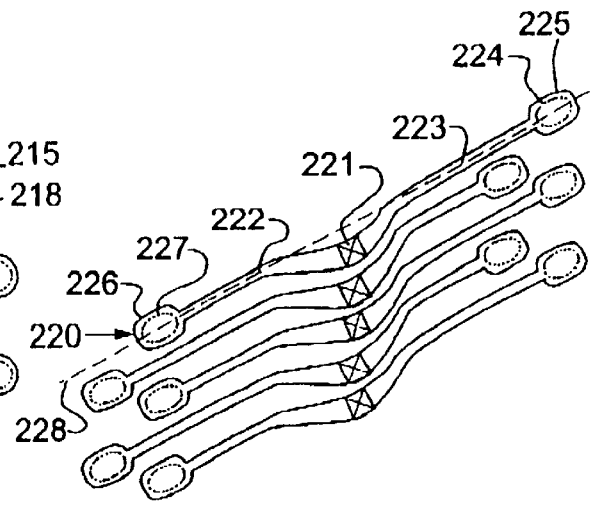

A compliant probe 220 in FIG. 14D includes a sheet spring with a short segment 222 with a contact pad 226 joined to a post 227, and with a long segment 223 with a contact pad 224 joined to a post 225. The sheet spring supports a probe tip 221 that is disposed between segments 222 and 223 at a position that is offset from a centerline 228 of probe 220. Centerline 228 is an imaginary line that connects the centroid of post 225 with the centroid of post 227. Force applied to probe tip 221 creates a torque about centerline 228 that causes arms 222 and 223 to bend and to twist torsionally, thereby generating a counterforce that limits further deflection of probe tip 221.

Compliant probes according to teachings of this invention can be used for burn-in of wafers containing integrated circuits and other microelectronic devices. A wafer connector 230 shown in FIG. 15A incorporates probes 232, configured, for example, to the preferred embodiment illustrated in FIG. 10, on a surface of a silicon substrate 231. Each of probes 232 is connected to terminals 233 on contactor 230 by circuit traces 234 in silicon substrate 231. In this example, silicon is used as the material for substrate 231 in order to provide a thermal expansion coefficient that is matched to that of a silicon wafer containing integrated circuits under burn-in test.

In performing burn-in, connector 230 is aligned to a wafer under test and then held with a mechanical clamping means such that each probe of the connector is biased against a mating contact pad on the wafer with a force sufficient to assure reliable contact. Applicant has determined that to contact standard aluminum pads, a force of from 5 to 10 grams is sufficient to assure contact. The assembly is then heated to the burn-in temperature, typically 125° C. to 150° C. Electrical stimuli are applied to each integrated circuit to exercise the circuit and accomplish dynamic burn-in at the burn-in temperature.

Figure 15B:
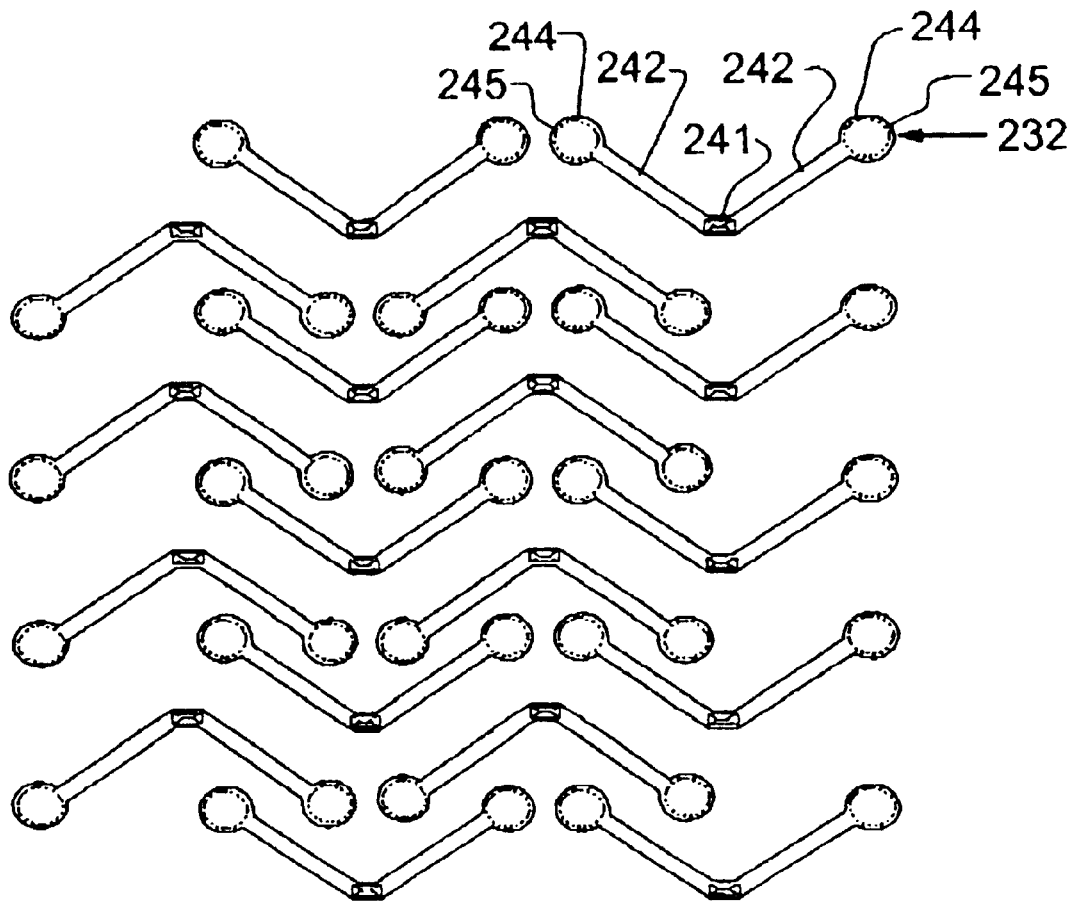
FIG. 15B shows a top plan view of a selected area of the connector of FIG. 15A for devices with area array contacts.
Figure 15A:
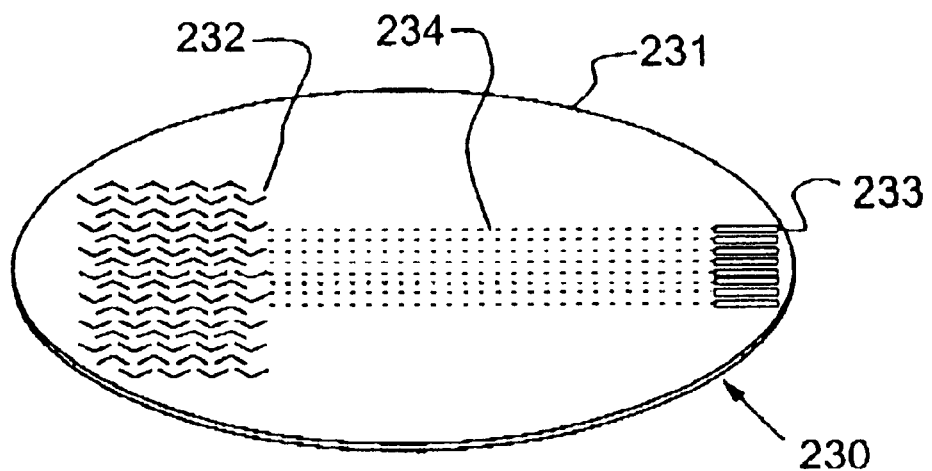
FIG. 15A shows a connector for wafer level burn-in of devices with area array contacts.

FIG. 15B shows a portion of the probes that are disposed on the surface of connector 230. The probe tips are arranged in an area array that is matched to an area array of contact pads on flip-chips being tested. Each probe tip 241 is positioned to mate with a corresponding contact pad on the flip-chip. The dimensions of probe 232 are compatible with a grid pitch spacing of between 150 microns and 500 microns currently utilized for flip-chips. Probes 232 are arranged in a nested pattern that allows each probe to fit the space available. In a preferred embodiment, additional non-functional probes are added to the array to provide support to the wafer under test in local regions where the average density of contact pads on the wafer is low. Any required dimensions are suitable for the invention.

Probe tips 241 of probe 232 provide a hard surface for the purpose of breaking through any oxide on the aluminum bond pads on the wafer under test. Probe tip 241 is disposed at the apex of a "V" shaped elongated thin sheet 242 that is supported by posts 245 joined to contact pads 244 at each end of sheet 242.

Compliant probes according to the teachings of this invention provide a means to test high-speed integrated circuits because of the low self and mutual inductance of each probe. A probe card 249 incorporating compliant probes is shown in FIG. 16A. Probes 240 are disposed in an area array pattern on a substrate 248 suitable for testing flip-chips with area array contact pads. Each probe 240 is connected electrically to terminals 247 on probe card 249 by circuit trace means 246 incorporated in substrate 248. Substrate 248 is preferably made of a dimensionally stable base such as alumina ceramic material, on which circuit traces are disposed between layers of polyimide dielectric material.

Figure 16B:
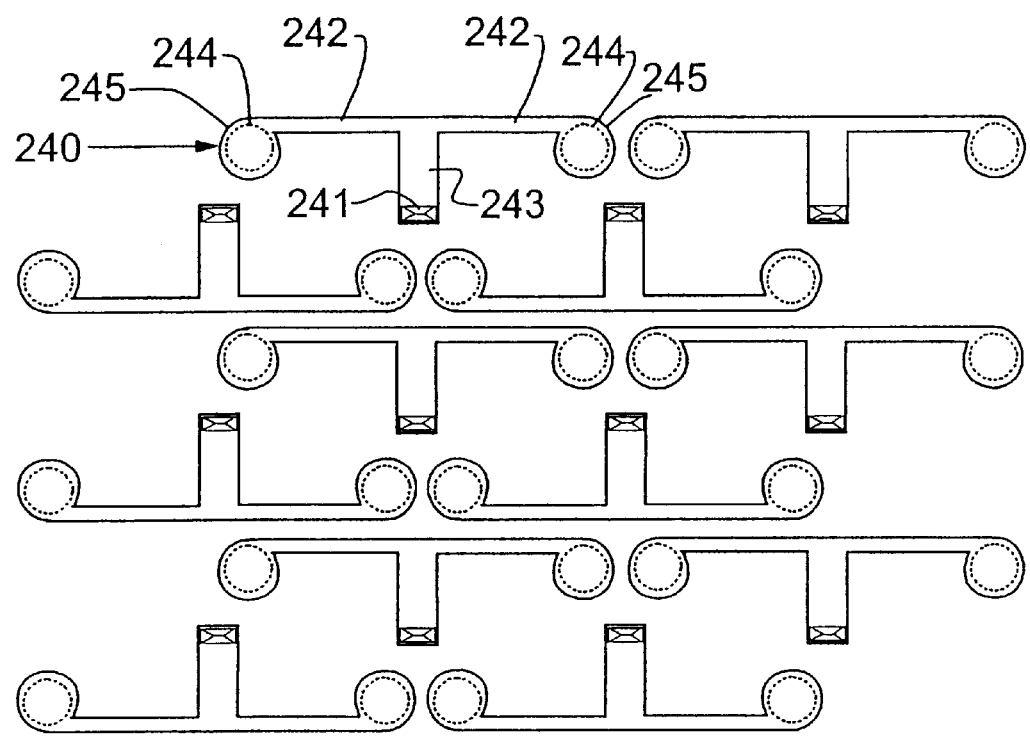
FIG. 16B shows a top plan view of a selected area of the probe card of FIG. 16A for devices with area array contacts.
Figure 16A:
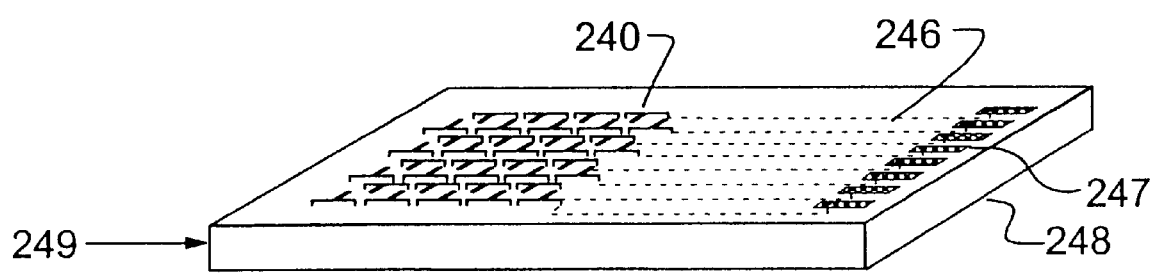
FIG. 16A shows a probe card for wafer level testing of devices with area array contacts.

FIG. 16B shows an array of compliant probes 240 configured according to the teachings of the invention illustrated in FIG. 5, for example. A probe tip 241 is disposed at the end of extension arm 243 at the midpoint of elongated sheet spring 242. Support posts 244 are joined to contact pads 245 at each end of elongated sheet spring 242 so that probe tip 241 on arm 243 is moveably compliant in a vertical direction.

Figure 17B:
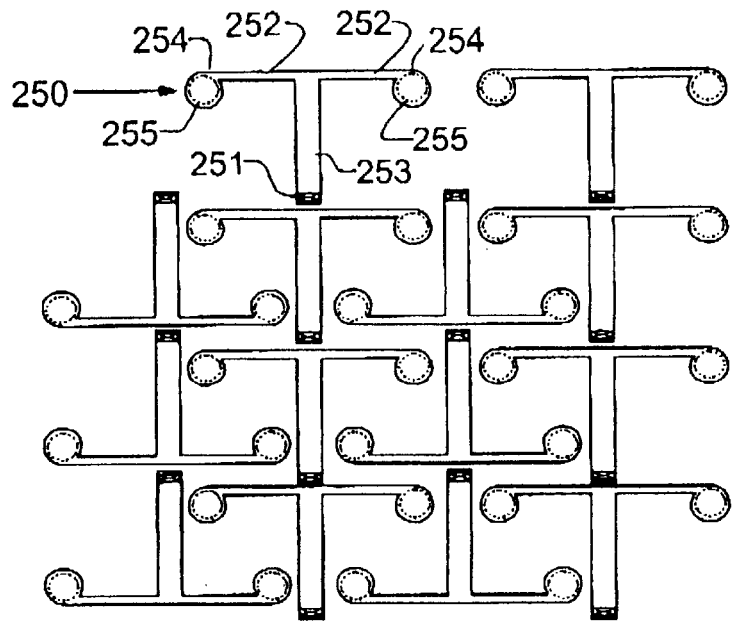
FIG. 17B shows a top plan view of a selected area of the socket of FIG. 17A for devices with area array contacts.
Figure 17A:
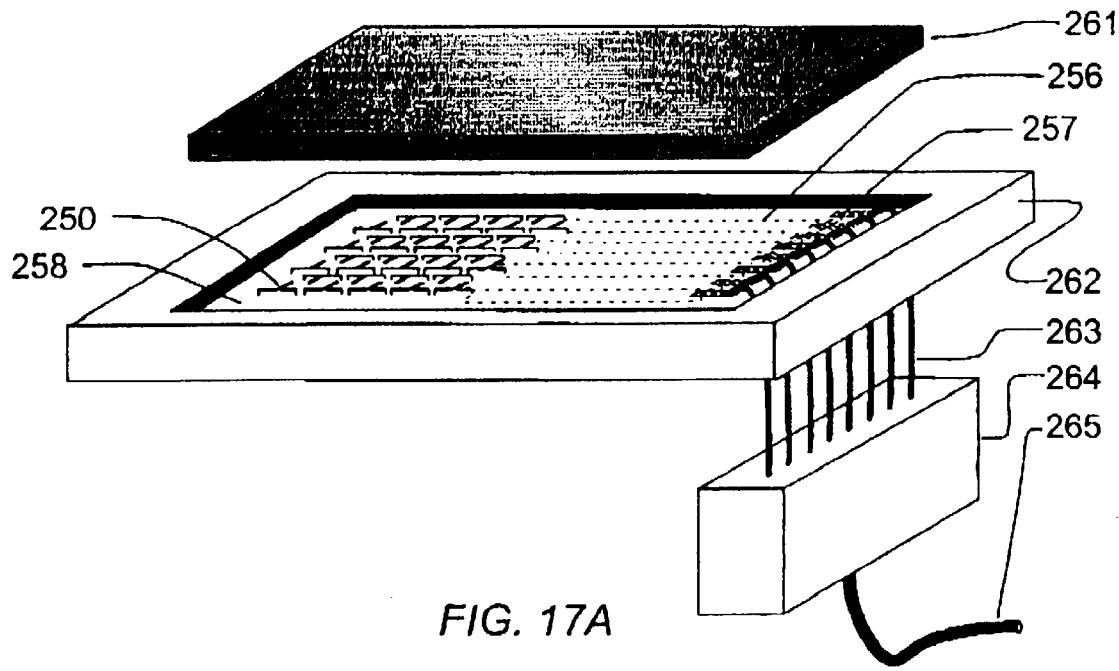
FIG. 17A shows a socket for operating microelectronic devices with area array contacts.

A chip socket shown in FIG. 17A provides a demountable means for testing, burning-in and operating flip-chips. Flip-chip 261 is held by positioning means 262 such that each contact pad on flip-chip 261 is mated with a corresponding probe 250 on the surface of socket substrate 258. Each probe 250 is connected electrically with terminals 257 on socket substrate 258 by circuit trace means 256. Electrical signals suitable for operating flip-chip 261 are directed to the socket by interconnection means 263 from electronic circuitry means 264. Cable 265 connects the electronic circuitry 264 to the system for burn-in, test or operation of flip chip 261.

FIG. 17B shows a portion of the array of compliant probes 240 in the socket of FIG. 17A. A probe tip 251 is disposed at the end of an extension arm 253 attached to the mid-point of an elongated sheet spring 252. Support posts 255 are joined to contact pads 254 at each end of elongated sheet spring 252.

Preferred embodiments of probe tips shown in FIGS. 18A to 18D are configured for specific applications in testing and burn-in. These probe tips and others are well known in the integrated circuit industry, and the examples presented here are representative of the many types of probe tips that are available. Methods of fabrication are well known to skilled practitioners in the art of manufacturing electrical contacts.

Figure 18A:
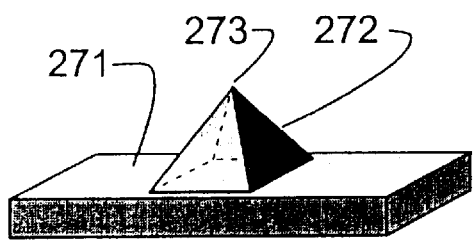
FIGS. 18A to 18D show probe tips for use in compliant probe structures according to the present invention.

A probe tip shown in FIG. 18A is preferred for probing aluminum bond pads on integrated circuits. A sharp apex 273 is suited to breaking through the oxide layer on aluminum bond pads. A pyramid 272 is formed by replication of an etch pit in a (100) silicon surface. Pyramid 272 is supported on a sheet spring 271. Apex 273 of pyramid 272 is sharply defined with an included angle of 54.75° between opposite faces. A hard material is used for probe tip 272, where the material is preferably selected from the group consisting of molybdenum, nickel, osmium, Paliney 7, rhodium, rhenium, titanium, tungsten, and their alloys. In probing soft contacts, materials such as osmium, rhodium, and tungsten are preferred because they react slowly with solders and other soft materials.

Figure 18B:
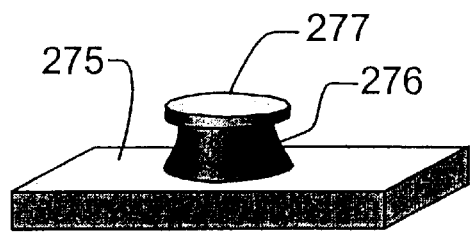

A probe tip shown in FIG. 18B is suited for contacting noble metal contact pads. A thin disk 277 is supported on a metal post 276 disposed on a sheet spring 275. Post 276 is undercut by chemical etching to expose edges of disk 277. Thin disk 277 is made of an inert metal preferably selected from the group consisting of gold, Paliney 7, Platinum, Rhodium, and their alloys.

Figure 18C:
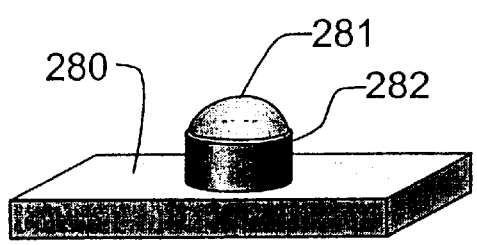

A probe tip shown in FIG. 18C is suited to contacting solder and other soft materials. A rounded metal tip 281 is supported on a metal post 282 that is disposed on a sheet spring 280. Rounded metal tip 281 can be shaped by flash laser melting of a high temperature material to reflow into the shape of a spherical section. Materials suitable for rounded metal tip 281 include nickel, platinum, rhodium, cupro-nickel alloys, beryllium-copper alloys, and Paliney 7.

Figure 18D:
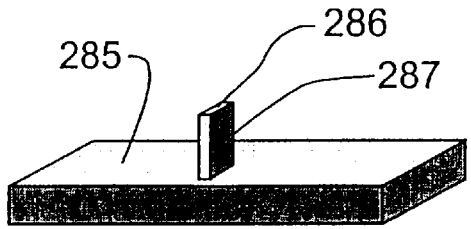

A probe tip shown in FIG. 18D is suited to contacting small contact pads and pads that are spaced closely together. A probe tip 287 with a top edge 286 is disposed on the top surface of a sheet spring 285. Probe tip 287 is preferably formed by plating the edge of a sacrificial material and then removing that material to leave a thin sheet of metal 287 projecting vertically from sheet spring 285.

Although several preferred embodiments of the invention have been described, numerous modifications and alternatives thereto would be apparent to one having ordinary skill in the art without departing from the spirit and scope of the invention as set forth in the following claims.

What is claimed:

1. A probe for making electrical connection to contact pads on microelectronic devices, said probe comprising:
    (a) a sheet of conductive material with a main body having a first and a second end, said main body acting as a torsional spring;
    (b) a rigid substrate with a top and a bottom surface;
    (c) at least one first rigid electrically conductive post supporting said first end of said main body above said top surface of said substrate;
    (d) at least one second rigid electrically conductive post supporting said second end of said main body above said top surface of said substrate;
    (e) an arm of said sheet extending away from said main body; and
    (f) an electrically conductive tip structure with a base disposed on said top surface of said arm distal from said main body and a tip point extending away from said top surface of said arm, wherein a bias of said conductive tip toward said substrate causes substantial torsional distortion of said main body of said sheet.

2. The probe of claim 1 wherein said sheet is a substantially flat metal foil with a longest dimension of between 150 micrometer and 1500 micrometers, and with a thickness of between 10 micrometers and 75 micrometers.

3. The probe of claim 1 wherein said arm is of a V shape, with a thickness greater than thickness of said main body.

4. The probe of claim 1 wherein said conductive material is a metal selected from the group consisting of beryllium-copper, columbium, cupro-nickel, molybdenum, nickel, nickel-titanium, stainless steel, titanium, tungsten, and alloys thereof.

5. The probe of claim 1 wherein said conductive tip is of a hard metal selected from the group consisting of chromium, nickel, osmium, Paliney 7, rhenium, rhodium, titanium, tungsten, and alloys thereof.

6. The probe of claim 1 further including a ground plane shield on a region of said substrate that underlies said electrically conductive tip.

7. The probe of claim 1 wherein said electrically conductive tip comprises a pyramid.

8. The probe of claim 1 wherein said electrically conductive tip comprises a cylindrical metal projection oriented substantially vertically above said sheet.

9. The probe of claim 1 wherein said electrically conductive tip comprises a spherical section of metal.

10. The probe of claim 1 wherein said rigid posts are electroplated metal.

11. The probe of claim 1 further including an elastic dielectric material disposed between said sheet and said top surface of said substrate.

12. The probe of claim 11 wherein said elastic dielectric material is selected from the group consisting of silicone, fluorosilicone, fluorocarbon, and urethane elastomer.

13. A probe for making electrical connection to contacts on microelectronic circuits, said probe comprising:
    (a) a rigid substrate;
    (b) an elongated thin spring with a top and a bottom surface;
    (c) at least one first rigid post supporting said spring at a first end above said substrate;
    (d) at least one second rigid post supporting said spring at a second end above said substrate;
    (e) an arm extending laterally from said spring to a distal end disposed at the mid point between said first end and said second end; and
    (f) a probe tip disposed at said distal end of said arm such that a force applied vertically to said probe tip causes torsional flexing of said elongated thin spring.

14. The probe of claim 13 further including a metal film ground plane on said substrate, said thin metal ground plane disposed under said electrically conductive tip.

15. The probe of claim 13 wherein said sheet comprises a planar sheet of metal patterned such that said pattern is curved in a direction parallel to said thin sheet.

16. The probe of claim 13 wherein said first post comprises a first metal post and said second post comprises a second metal post.

17. A probe for making electrical connections to contact pads on a microelectronic device, said probe comprising:
    (a) a rigid substrate;
    (b) a strip of electrically conductive material with a first and a second end, said strip disposed above said rigid substrate and acting as a torsional spring;
    (c) a rigid support at said first end and a rigid support at said second end of said strip;

(d) an arm of said strip extending in a direction substantially perpendicular to an axis between said first end of said strip and said second end of said strip;
(e) an electrically conductive tip disposed on a distal end of said arm;
(f) whereby a bias of said conductive tip toward said substrate is operative to cause torsional flexure of said thin strip.

* * * * *